United States Patent [19]

Sawada et al.

[11] Patent Number: 5,763,057
[45] Date of Patent: Jun. 9, 1998

[54] SEMICONDUCTOR CHIP HAVING A DUMMY PATTERN

[75] Inventors: Hideki Sawada; Hiromi Ogata, both of Kyoto, Japan

[73] Assignee: Rohm Co., Ltd., Kyoto, Japan

[21] Appl. No.: 997,093

[22] Filed: Dec. 29, 1992

[30] Foreign Application Priority Data

Jan. 6, 1992 [JP] Japan .................. 4-000273

[51] Int. Cl.⁶ .................. B32B 3/00; H01L 21/00
[52] U.S. Cl. .................. 428/209; 428/210; 428/457; 428/458; 438/462; 438/926
[58] Field of Search .................. 428/209, 210, 428/457, 458; 437/226, 227, 41, 912; 257/734; 438/462, 926

[56] References Cited

U.S. PATENT DOCUMENTS

| | | | |
|---|---|---|---|
| 3,897,627 | 8/1975 | Klatskin | 437/226 |
| 4,073,055 | 2/1978 | Kimura | 437/226 |
| 5,017,512 | 5/1991 | Takagi | 437/227 |
| 5,206,181 | 4/1993 | Gross | 437/226 |
| 5,430,325 | 7/1995 | Sawada et al. | 257/618 |

FOREIGN PATENT DOCUMENTS

| | | | |
|---|---|---|---|
| 58-137228 | 8/1983 | Japan | 437/227 |
| 58-166741 | 10/1983 | Japan | 437/227 |
| 63-228640 | 9/1988 | Japan | 437/227 |

*Primary Examiner*—Marie Yamnitzky
*Attorney, Agent, or Firm*—Baker & Botts, L.L.P.

[57] ABSTRACT

A narrow dummy pattern made of aluminum is formed between an identification area of a semiconductor chip and a dicing line to prevent film peeling in a dicing operation from reaching the identification area.

3 Claims, 1 Drawing Sheet

SEMICONDUCTOR CHIP HAVING A DUMMY PATTERN

BACKGROUND OF THE INVENTION

The present invention relates to a semiconductor chip having an identification mark that is subjected to die bonding and wire bonding operations by an automatic machine.

For example, in a manufacturing process of LED heads to be mounted on a facsimile machine, printer, etc., an automatic machine performs a wire bonding operation on LED chips and ICs based on information of an identification mark and an identification area that are provided on each LED chip.

This is explained below in more detail with reference to FIG. 2. In general, dicing lines 3 are drawn at the periphery of semiconductor chips 10, such as LED chips, on which die bonding and wire bonding operations are to be performed. Individual chips are separated by a dicing operation performed along the lines 3. In the subsequent steps, an automatic machine bonds the separated chip 10 onto a substrate and connects it to an IC etc. by wire bonding. An identification mark 1 and an identification area 2 that includes the identification mark 1 are used as a reference of the die bonding and wire bonding operations. Recognizing binarized information of the identification mark 1 and the identification area 2, the automatic machine performs the die bonding and wire bonding operations at respective predetermined positions.

As shown in FIG. 2, the identification mark 1 is usually provided at a corner of the semiconductor chip 10 in the vicinity of the dicing line 3 and, as a matter of course, the identification area 2, which includes the identification mark 1, is also provided in the vicinity of the dicing line 3. It sometimes occurs that a film on the semiconductor chip 10 is peeled off starting from a cutting edge of the dicing operation (particularly from a corner of the chip 10). No problems will be caused if a peeled film portion 5 (hatched portion in FIG. 2) does not reach the identification area 2. However, if it reaches the identification area 2, the frequency of recognition errors of the automatic machine increases. In particular, if the peeled film portion 5 reaches the identification mark 1, the probability of the recognition error abruptly increases. This is explained as originating from the fact that the surface states of the identification mark 1 and the identification area 2 are changed from their normal states and the information of the identification mark 1 and the identification area 2 is changed from the original one.

SUMMARY OF THE INVENTION

An object of the present invention is, therefore, to reduce the frequency of recognition errors caused by film peeling that occurs in a dicing operation on semiconductor chips.

According to the invention, a semiconductor chip comprises:

a device area in which a semiconductor device is formed;

an identification area including an identification mark, the identification area being formed in the vicinity of a dicing line; and a dummy pattern formed between the identification area and the dicing line, for preventing film peeling in a dicing operation from reaching the identification area.

DESCRIPTION OF THE PREFERRED EMBODIMENTS

A semiconductor chip according to an embodiment of the present invention is described below.

Figure 1:
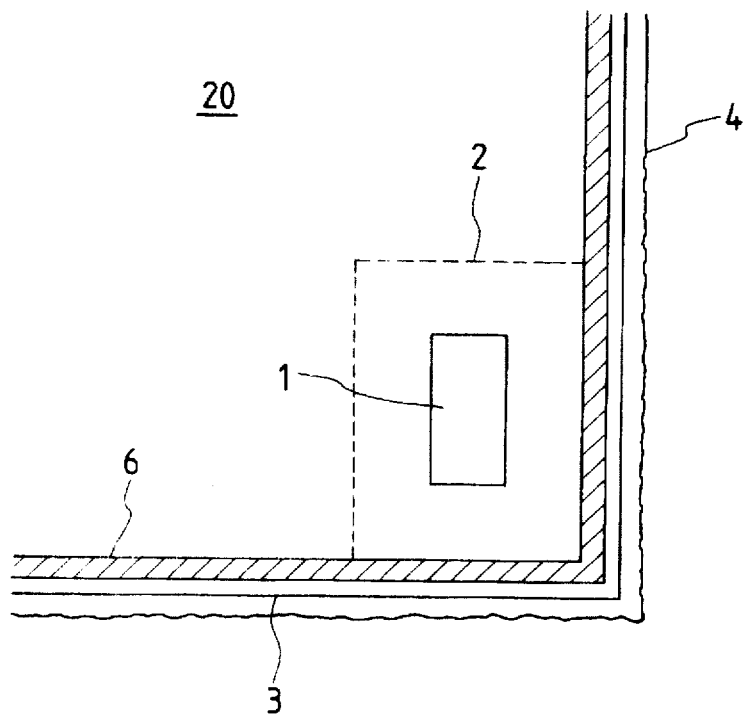
FIG. 1 is a plan view showing part of a semiconductor chip according to an embodiment of the present invention.
Figure 2:
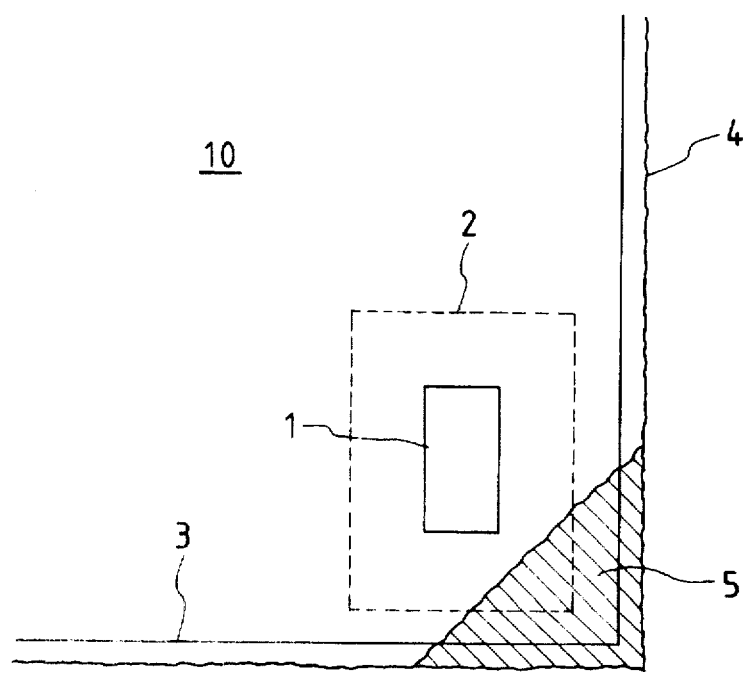
FIG. 2 is a plan view showing part of a conventional semiconductor chip.

FIG. 1 is a plan view showing part of a semiconductor chip according to an embodiment, in which the same elements as the conventional semiconductor chip are represented by the same reference numerals. A semiconductor 20 has been separated by dicing along the predetermined dicing line 3. A cutting edge 4 has been formed around the chip 20. The predetermined identification mark 1 and the identification area 2 are provided at a corner of the semiconductor chip 20 in the vicinity of the dicing line 3.

A dummy pattern 6, which is the characterizing feature of the invention, is made of aluminum, located between the identification area 2 and the dicing line 3, and extends along the dicing line 3 so as to have a constant width. In particular, the two sides of the identification area 2 coincide with the end line of the dummy pattern 6, that is, the end line of the dummy pattern 6 constitutes a boundary line of the identification area 2.

Although in this embodiment the dummy pattern 6 is provided at the peripheral portion of the semiconductor chip 20 along the dicing line 3, it is not always necessary to provide the dummy pattern at the peripheral portion. It suffices that the dummy pattern 6 is provided so as to prevent the film peeling from reaching the identification area 2.

Aluminum is most suitable as a material for the dummy pattern 6 in terms of the ease of pattern formation. However, there are no limitations on the material and shape (e.g., width and length) of the dummy pattern 6 as long as they can provide the dummy pattern 6 capable of preventing the film peeling in the dicing operation from reaching the identification area 2.

In the semiconductor chip 20 as described above, even if a film is peeled off starting from the edge 4 in the dicing operation, the progress of the film peeling is stopped by the dummy pattern 6, so that no film peeling occurs in the identification area 2, not to mention, in the identification mark 1. Therefore, the information of the identification mark 1 and the identification area 2 is not changed, making extremely low the probability of recognition errors of the automatic machine during the die bonding and wire bonding operations. Further, manufacturing costs can be reduced due to an improvement of the straight pass yield, a reduction of the rework rate, etc.

What is claimed is:

1. A semiconductor chip comprising:

a device area in which a semiconductor device is formed;

an identification area including an identification mark, the identification area being formed between the device area and a dicing line; and a dummy pattern formed between the identification area and the dicing line and spaced from the dicing line, for preventing film peeling in a dicing operation from reaching the identification area.

2. The semiconductor chip of claim 1, wherein the dummy pattern is a line extending adjacent to the dicing line.

3. The semiconductor chip of claim 1, wherein the dummy pattern is made of aluminum.

* * * * *